US006855567B1

(12) United States Patent
Ni et al.

(10) Patent No.: US 6,855,567 B1
(45) Date of Patent: Feb. 15, 2005

(54) ETCH ENDPOINT DETECTION

(75) Inventors: Tuqiang Ni, Fremont, CA (US); Andrew Lui, Fremont, CA (US); Chung-Ho Huang, Fremont, CA (US); Weinan Jiang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 260 days.

(21) Appl. No.: 09/586,530

(22) Filed: May 31, 2000

(51) Int. Cl.[7] .............................................. H01L 21/02
(52) U.S. Cl. ........................... 438/8; 438/689; 438/690
(58) Field of Search .............................. 438/8, 689, 690

(56) References Cited

U.S. PATENT DOCUMENTS

| | | | | |
|---|---|---|---|---|
| 5,131,752 A | * | 7/1992 | Yu et al. ...................... 356/369 |
| 5,308,447 A | * | 5/1994 | Lewis et al. ................. 156/626 |
| 5,499,733 A | * | 3/1996 | Litvak .......................... 216/38 |
| 5,877,032 A | * | 3/1999 | Guinn et al. ................... 438/9 |
| 5,966,586 A | * | 10/1999 | Hao .............................. 438/7 |

* cited by examiner

*Primary Examiner*—Nadine G. Norton
*Assistant Examiner*—Matt Song
(74) *Attorney, Agent, or Firm*—Martine, Penilla & Gencarella, LLP

(57) ABSTRACT

A method for determining an endpoint for etching a layer includes steps of estimating the etch endpoint and, during etch, directing radiant energy at two or more wavelengths onto the layer to be etched, detecting the last intensity maximum reflected at a first wavelength prior to the estimated etch endpoint, and detecting the intensity maximum reflected at a second wavelength first occurring after the last intensity maximum at the first wavelength. Also, a method for determining an endpoint for etching a layer having an approximate initial thickness by steps of, during etch, directing radiant energy at three or more wavelengths onto the layer to be etched; selecting first, second, and third wavelengths; approximating an etch rate from the time interval between a first detected intensity minimum and an adjacent intensity maximum reflected at the third wavelength, estimating an etch endpoint from the approximate initial thickness of the layer and the approximate etch rate; detecting the last intensity maximum reflected at the first wavelength prior to the estimated etch endpoint; and detecting the intensity maximum reflected at the second wavelength first occurring after the last intensity maximum at the first wavelength. The material making up the layer is at least partly transparent to both the first and the second wavelength. The first wavelength is longer than both the second wavelength and the third wavelength. In some embodiments the third wavelength is longer than the second wavelength. The endpoint is at the point of intensity maximum of the second wavelength or is at a point following an interval thereafter.

15 Claims, 6 Drawing Sheets

ETCH ENDPOINT DETECTION

FIELD OF THE INVENTION

This invention relates to control of etch processes in integrated circuit fabrication and, more particularly, to etch endpoint detection.

BACKGROUND

Fabrication of integrated circuits on semiconductor wafers involves repetitive application of processes, such as masking, etching, layer formation, and doping. This invention primarily concerns the etching process, that is, the process of removing selected portions of layers of material during integrated circuit fabrication.

As the densities and complexities of semiconductor devices have increased, the sizes of the various features have decreased, and the progress toward smaller feature sizes has given rise to a need for improved control over the etching process. It can be particularly desirable, for example, that the edge profile be straight and vertical and sharply defined. And, for example, it can be particularly desirable that the etching process be controllable so that etching can be stopped after the portion of the etched layer has been fully etched through, but before an unacceptable amount of the underlying material has been etched away.

Any of various anisotropic etching techniques can provide a sharply defined steep (high aspect ratio) edge profile. Suitable anisotropic techniques include dry etching by ion sputtering, and ion assist etching such as, for example, the Lam Research TCP 9400 polysilicon etcher.

Some etch techniques are selective to some degree, that is, the techniques remove some materials more rapidly than other materials, and an etch technique may be selected that is selective for the etched material as compared with the underlying material. Typically, anisotropic techniques providing an acceptable edge profile are not highly selective for the etched material as compared with the material underlying the etched layer, and permitting the process to continue etching after a portion of the underlying layer has been results in removal of part of the underlying material, which may produce a defect.

The length of time required to complete an etch of a particular material using a particular etch technique can be approximated on the basis of experience or by trial. Owing to variations in processing, however, different wafers in a process run can in practice have significantly different etch rates. An etching strategy that simply allows an etch to proceed for a predetermined length of time poses a risk that on some wafers etch will be incomplete or that underlying material will be etched. Accordingly, in state-of-the art processing, some provision is typically made for monitoring the etch process to determine when the etch has proceeded to the point at which some portion of the underlying layer is exposed. One approach to detecting when the underlayer has been exposed is to monitor the plasma emission product; a change in the plasma emission product signals exposure of the underlayer, and at that point the process is switched to a more highly selective etch technique, often termed an "over etch".

One approach to etch endpoint detection, useful in processes for etching transparent materials such as silicon dioxide ($SiO_2$), or partially transparent materials such as polysilicon, employs interferometry. In this approach a beam of photons at a wavelength to which the material to be etched is at least partially transparent, is directed at the layer that is to be etched, and a reflected portion of the beam is detected by a suitable photodetector. Some of the beam is reflected by the front (upper) surface of the layer to be etched, and some is reflected by the back (lower) surface of the layer to be etched. These reflected components interfere optically according to the relation $$2d = N(\lambda/n),$$

where d is the thickness of the layer along the path of the beam, $\lambda$ is the wavelength of the photon beam, and n is the refractive index of the layer material. As will be appreciated, the front and rear surfaces of the layer to be etched may be described as interfaces at the upper limit of the layer material and between the layer material and the underlying layer. Where there is no phase reversal at the interfaces, for integral values of N, that is N=1, 2, 3 . . . , the reflected components interfere constructively, producing intensity maxima; and for half-integral values of N, that is, where N=½, ³⁄₂, ⁵⁄₂ . . . , the reflected components interfere destructively, producing intensity minima. Where the different refractive indices at the interface result in a phase reversal at one of the surfaces, as is the case where the layer to be etched is a polysilicon (refractive index about 4) and the underlying layer is a silicon dioxide (refractive index about 1.5), for example, intensity minima are produced at integral values of N and intensity maxima are produced at half-integral values of N.

During the course of removal of material by the etch, as the thickness d of the layer decreases, the intensity of the reflected portion of the beam cycles sinusoidally over time. The distance between adjacent intensity maxima is ½($\lambda/n$), so that monitoring features of the intensity curve during etch can provide measures of the thickness of material removed from the etched layer and of the etch rate. A change from the sinusoidal time-course of intensity occurs more or less abruptly at the moment the thickness of the layer reaches 0, that is, at the moment the etch is complete. One conventional way to attempt to detect etch endpoint is to try to recognize, as precisely as practicable, an abrupt change in the shape of the intensity curve.

It is possible, at least in principle, to employ interferometry to calculate an etch depth, by counting interference fringes at a particular wavelength. In practice, however, the material being etched may not be sufficiently transparent at useful wavelengths. Polysilicon, for example, absorbs more at shorter wavelengths, so that at interference fringes from shorter wavelengths may not be detectable over the full thickness of the layer. Polysilicon is more transparent to longer wavelengths, but the resulting interference fringes are farther apart, so that etch depth cannot be accurately determined from them. Moreover, the initial thickness of the layer to be etched can vary significantly from one wafer to another within a run, and, because counting fringes provides only a measure of etch depth, the thickness of material remaining varies significantly as well.

As the dimensions of features in integrated circuits have decreased, the thicknesses of certain of the layers have also become exceedingly small. The dimensions must fall within increasingly smaller tolerances, so that even a small degree of etch in the material underlying an etched layer, which may result from permitting the etch process to continue even a very short time beyond the endpoint, can result in defective performance. A need exists, therefore, for increasingly precise etch endpoint detection.

SUMMARY

In one general aspect the invention features a method for determining an endpoint for etching a layer by steps of estimating the etch endpoint and, during etch, directing radiant energy at two or more wavelengths onto the layer to be etched, detecting the last intensity maximum reflected at a first wavelength prior to the estimated etch endpoint, and detecting the intensity maximum reflected at a second wavelength first occurring after the last intensity maximum at the first wavelength. The layer is at least partly transparent to the longer wavelength at the full thickness of the layer, and at least partly transparent to the shorter wavelength at layer thicknesses toward the endpoint. That is, the material making up the layer is sufficiently transparent to the first wavelength that at least a portion of a component of the first wavelength reflected from the back surface is detectable through the fall initial thickness of the layer, and the material making up the layer is sufficiently transparent to the second wavelength that at least a portion of the component of the second wavelength reflected from the back surface is detectable toward the end of the etch, so that the second wavelength maximum can be detected. The first wavelength is longer than the second wavelength. The endpoint is at the point of intensity maximum of the second wavelength or is at a point following an interval thereafter.

In another general aspect the invention features a method for determining an endpoint for etching a layer having an approximate initial thickness by steps of, during etch, directing radiant energy at three or more wavelengths onto the layer to be etched; selecting first, second, and third wavelengths; approximating an etch rate from the time interval between a first detected intensity minimum and an adjacent intensity maximum reflected at the third wavelength, estimating an etch endpoint from the approximate initial thickness of the layer and the approximate etch rate; detecting the last intensity maximum reflected at the first wavelength prior to the estimated etch endpoint; and detecting the intensity maximum reflected at the second wavelength first occurring after the last intensity maximum at the first wavelength. The material making up the layer is at least partly transparent to both the first and the second wavelength. The first wavelength is longer than both the second wavelength and the third wavelength. In some embodiments the third wavelength is longer than the second wavelength. The endpoint is at the point of intensity maximum of the second wavelength or is at a point following an interval thereafter.

In some embodiments the etching process forms gates, and the layer underlying the etched layer is a gate oxide layer. In some embodiments the layer to be etched is a polysilicon, which may be doped or not, or is some other material such as an amorphous silicon, for example; and the underlying layer is a dielectric material such as, for example, a silicon dioxide. The layer to be etched may further include in some applications, a silicide over the polysilicon.

In another general aspect the invention features a method for etching a layer, by performing a main etch using an anisotropic etch method and employing the steps according to the invention as described above for determining etch endpoint; stopping the main etch at the etch endpoint, and then completing the etch using a more selective finish etch technique.

The method can be used to particular advantage where the layer underlying the etched layer is very thin, and where the thickness of the underlying layer is a critical parameter for performance of the device. These circumstances pertain, for example, where the etch is used to form gates, and where the underlying layer is very thin, as, for example, a gate oxide layer having a thickness in the range from as thin as about 15 Å to as thick as about 40 Å.

In another general aspect the invention features apparatus for carrying out the etch endpoint determination and etch method of the invention as described above, including a process chamber, a source of light at two or more wavelengths, a light detector sensitive at two or more of the source wavelengths, means for directing the light from the source onto the layer to be etched in a wafer in the chamber and for conducting reflected light to the detector, and signal processing means adapted to determine intensity maxima over the course of the etch at two or more wavelengths in the reflected light.

DETAILED DESCRIPTION

The invention will now be described in detail, with reference to drawings illustrating examples of representative embodiments of the invention.

As will be appreciated, the drawings are diagrammatic and not to scale; in particular, some dimensions are exaggerated for clarity of presentation.

Figure 1A:
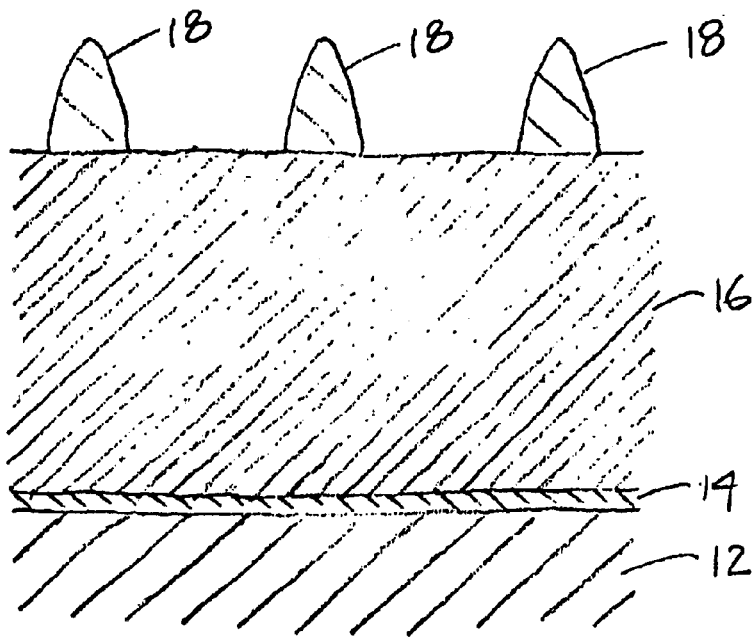
FIGS. 1A, 1B, 1C and 1D are diagrammatic sketches in sectional view thru a portion of a partially processed semiconductor wafer, showing steps in an etch process.

An etch process is illustrated in FIGS. 1A, 1B, 1C and 1D, showing diagrammatically by way of example a mask etch of portions of a polysilicon layer over a gate oxide layer to form polysilicon gates. Referring now to FIG. 1A, there is shown a sectional view of a portion of a partially processed semiconductor wafer. A gate oxide layer 14 of silicon dioxide is formed on a semiconductor substrate 12, and a polysilicon layer 16 is formed over the gate oxide layer 14. Photoresist 18 is patterned upon the polysilicon layer according to the desired arrangement of gates.

Figure 1B:
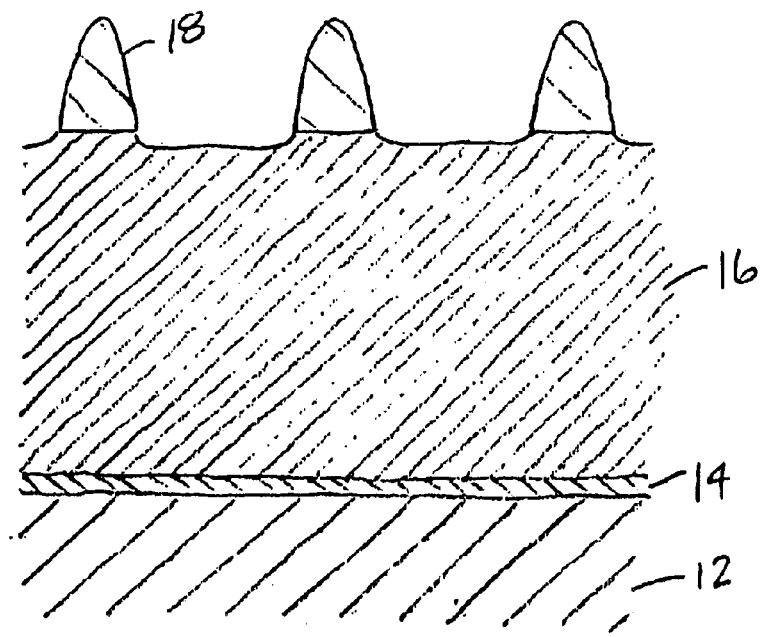

Typically part of the polysilicon layer at and near the upper surface becomes oxidized during processing to this point, and an aggressive "breakthrough etch" may be employed to remove the surface polysilicon oxide. Suitable etch techniques for a polysilicon oxide breakthrough etch include, for example, use of fluorine-containing species such as, e.g., $CF_4$ or $C_2F_6$. FIG. 1B shows the appearance of a partially processed semiconductor wafer as in FIG. 1A, after breakthrough etch.

Figure 1C:
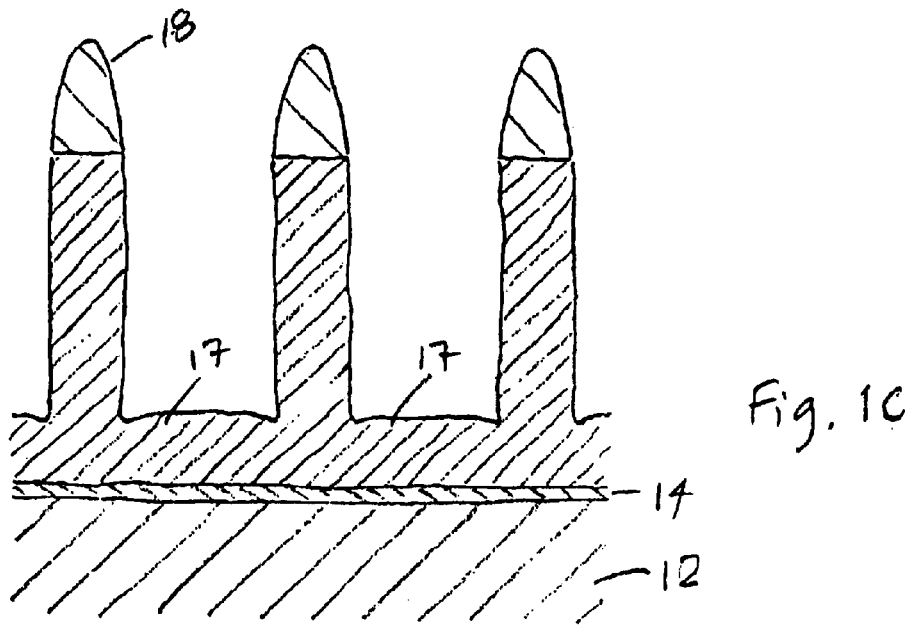

Following a breakthrough etch, where such is employed, a "main etch" is used to remove the bulk of the polysilicon material layer. FIG. 1C shows the appearance of a partially processed semiconductor wafer as in FIG. 1A, following main etch. The main etch is performed using an anisotropic etch technique, to provide sharply defined edge profiles having a high aspect ratio. Suitable etch techniques for a main etch in polysilicon include, for example, use of chlorine gas and HBr at a low pressure such as, e.g., 10–20 millitorr. Such anisotropic etch techniques are typically poorly selective for polysilicon over silicon dioxide and, to prevent etching of the underlying gate oxide layer, the main etch has been terminated at a point at which a small amount of polysilicon 17 remains to be removed. That is to say, the main etch is stopped before all of the polysilicon has been removed.

Figure 1D:
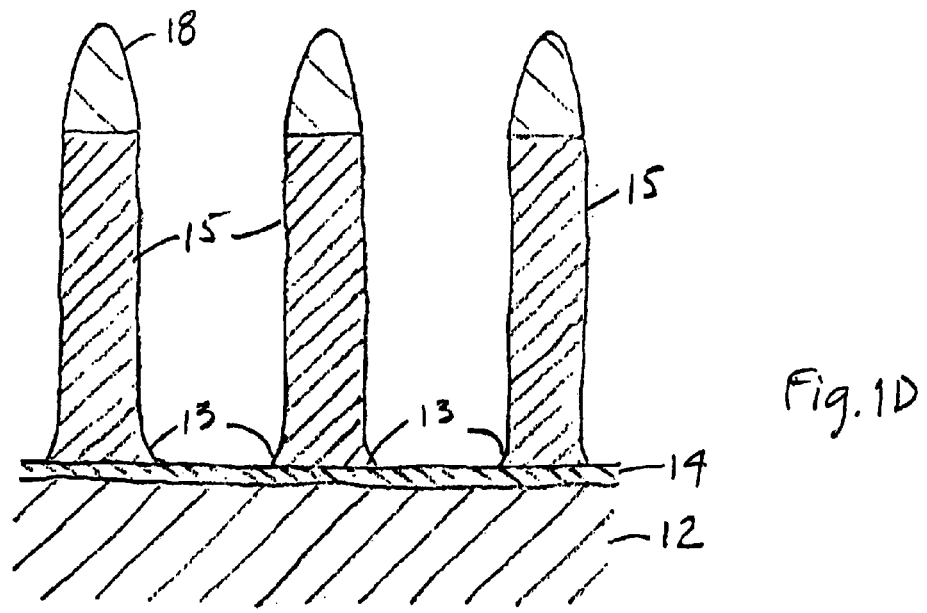

The etch is completed by use of a more highly selective etch technique to remove the remaining polysilicon without etching the underlying gate oxide to an unacceptable extent. Suitable etch techniques for completing an etch in polysilicon over a silicon dioxide include, for example use of oxygen gas plus HBr at higher pressure such as, e.g., at least about 30 millitorr and as high as about 80 millitorr. Such selective etch techniques provide a relatively poor edge profile, however. The result appears in FIG. 1D, showing a suitably high aspect ratio with a well-defined edge profile on much of the resulting gates 15, with a somewhat poorer edge profile 13 nearer the gate oxide layer 14.

A similar process may be employed to etch any of a variety of layer materials to any of a variety of underlying material such as silicon oxide or other dielectric material. Because the more selective finish etch yields a poorer edge profile, the challenge, in general, is to employ the anisotropic main etch as far down toward the underlying layer as possible without etching into it, in order to minimize the extent of material that must be removed by the finish etch.

According to the invention, an etch endpoint is determined by estimating the etch endpoint, and during etch directing radiant energy at two or more wavelengths onto the layer to be etched, detecting the last intensity maximum reflected at a first wavelength prior to the estimated etch endpoint, and detecting the intensity maximum reflected at a second wavelength first occurring after the last intensity maximum at the first wavelength.

Figure 2:
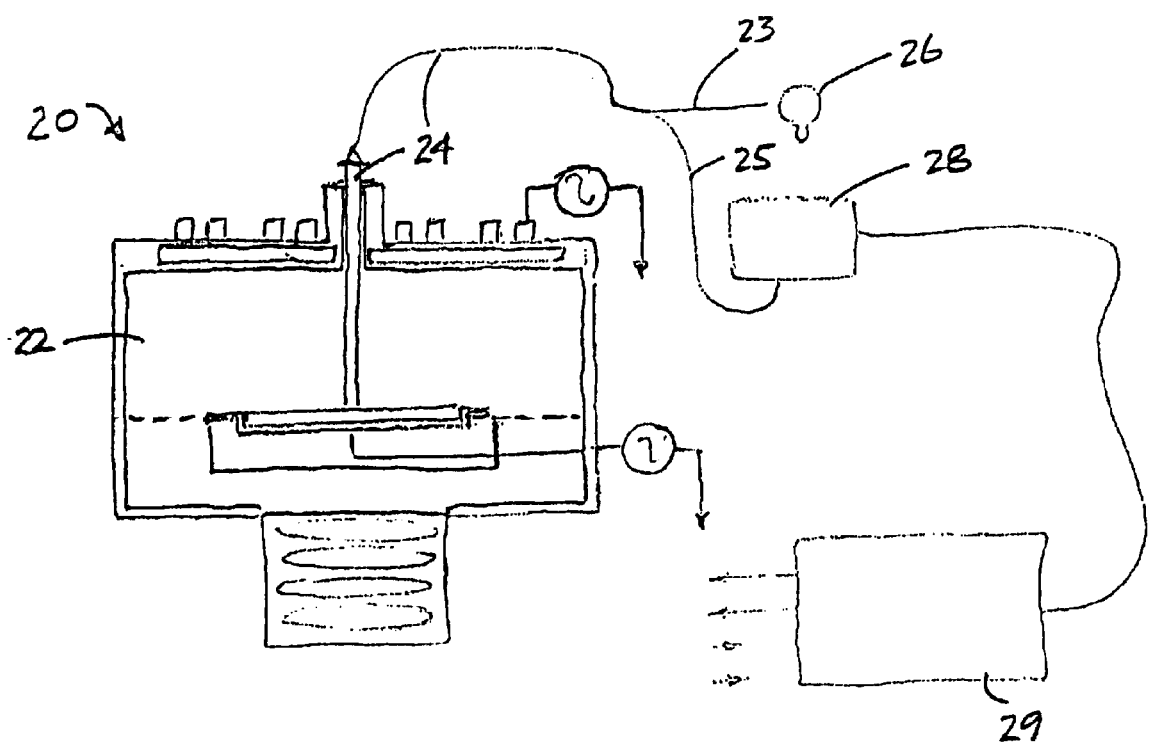
FIG. 2 is a diagrammatic sketch of apparatus for carrying out the method of the invention.

Apparatus for carrying out the invention is shown by way of example in FIG. 2, generally at 20. A processing chamber 22 is provided with means for holding the wafers during processing, means for transferring wafers, and means for exposing the wafers to the etch process. These parts of the apparatus can be conventional, and will in practice be selected according to the user's specifications and according to, for example, the chosen etch technique.

A fiberoptic bundle 24 is configured and arranged to direct light onto a wafer being processed in the chamber and to receive light reflected from the wafer. A portion 23 of the fibers in the fiberoptic bundle 24 are coupled to a broad band light source 26, so that they conduct light supplied by the source through the bundle and onto the wafer. Another portion 25 of the fibers in the fiberoptic bundle 24 are coupled to a detector 28, so that they conduct light reflected from the wafer through the bundle to the detector, where they reflected light is detected. A suitable fiberoptic bundle can be obtained from, for example, Oriel Instruments. The light source 26 provides light in at least two wavelengths to which the material of the layer to be etched is transparent or partly transparent (semitransparent); it may be preferable to use a broad band light source such as a xenon lamp or a halogen lamp for the light source 26. Suitable light sources can be obtained commercially from, for example, General Electric. The detector 28 is capable of detecting at least two wavelengths reflected from the wafer; it may be preferable to use a broad spectrum photodetector such as a CCD array or a diode array with a number of photon sensitive elements over a range of wavelengths. A suitable CCD array can be obtained commercially from, for example, Ocean Optics Corporation. A suitable diode array having more than 516 photon sensitive elements, and capable of acquiring full spectra ranging from 200 nm to 950 nm continuously, can be obtained commercially from, for example, Oriel Instruments. A suitably programmed computer 29 can receive and analyze data from the detector 28 and can control the process chamber 22. The computer 29 is provided with peripheral devices, including output devices such as display and printer and input devices for operator input.

As will be appreciated, any of a variety of means, known to the skilled artisan, may be employed for directing light in two or more wavelengths from a source onto the layer to be etched on a wafer in a process chamber, and for collecting and detecting light in two or more wavelengths reflected from the layer.

Figure 3:
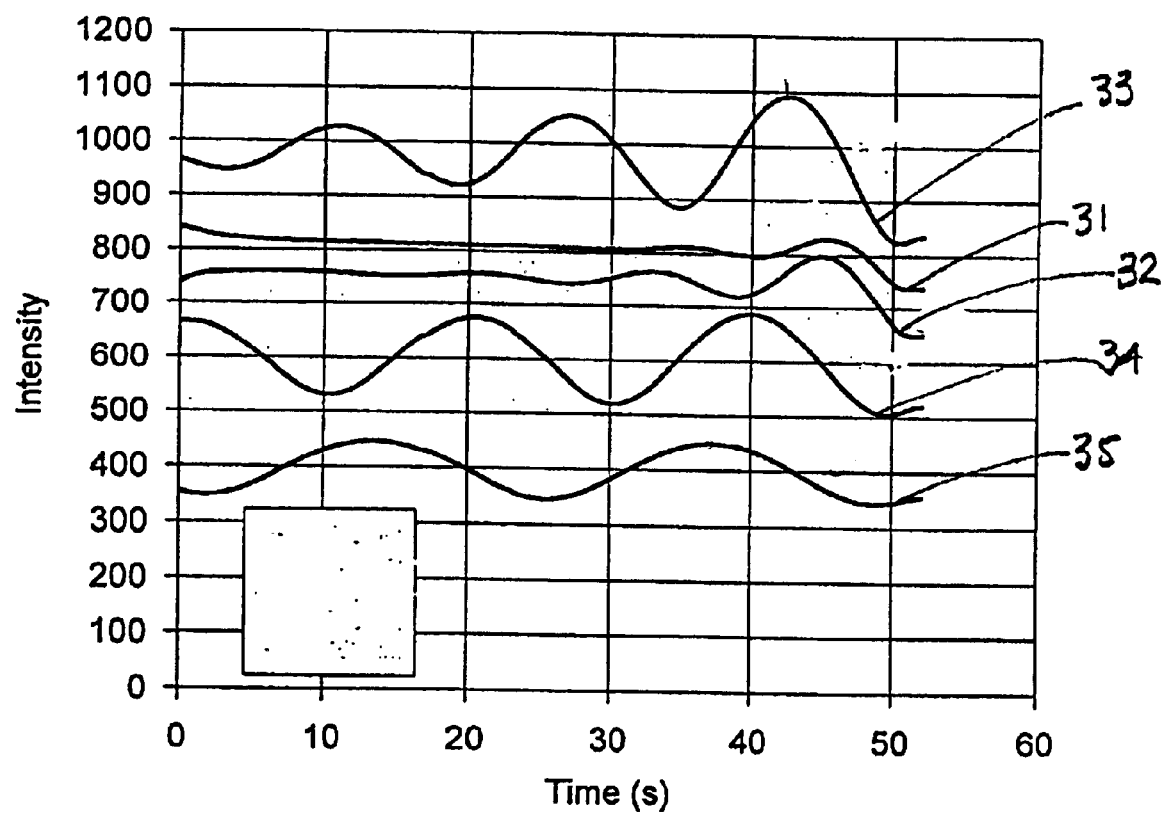
FIG. 3 is a plot showing interferometric traces made during the course of a polysilicon etch.

The wafer bearing the layer to be etched is positioned in the chamber, and the etch process is started. As the etch proceeds, light from the source is directed onto the layer being etched, and reflected light is detected by the detector. By way of illustration, FIG. 3 shows time traces, at wavelengths of 450 nm (31), 500 nm (32), 600 nm (33), 700 nm (34) and 800 nm (35) during etch of a polysilicon layer that was initially approximately 220 nm thick. Etch was initiated at about time 0, and etch was complete after about 50 seconds in this example. As predicted by the optical interference relation $2d=N(\lambda/n)$, and looking particularly at the traces for 800 nm, 700 nm and 600 nm, the traces show a generally sinusoidal relation of intensity over time, with a greater time interval between interference intensity maxima for longer wavelengths. The polysilicon used in this example is at least to some degree transparent to all the wavelengths shown in FIG. 3 but, because the extinction coefficient is greater for light at shorter wavelengths, oscillations appear in the traces for the shorter wavelengths 500 nm and 450 nm only after some etch time has passed and the polysilicon has thinned significantly. As the thickness of the polysilicon layer approaches zero (just before about 50 seconds in this example), the traces for all the wavelengths approach intensity minima.

In the example illustrated in FIG. 3, two interference intensity maxima appear in the trace at 800 nm, while three maxima appear in the trace at 600 nm. The second maximum in the trace at 800 nm occurred about three-quarters of the way into the etch time; that is, the last maximum at 800 nm prior to the etch endpoint occurred at a point in the process at which about one-fourth of the thickness of the polysilicon layer still remained to be etched away. Stopping the main etch at this point and completing the etch using a selective finish etch technique would result in an unsatisfactory edge profile. After the second maximum at 800 nm, the next detectable maximum at 500 nm, for example, occurred about nine-tenths of the way into the etch time; that is, the next maximum at 500 nm following the last maximum at 800 nm occurred at a point in the process at which only about one tenth of the thickness of the polysilicon layer remained to be etched away. Stopping the main etch at this point and completing the etch using a finishing etch would result in a satisfactory edge profile.

Figure 4:
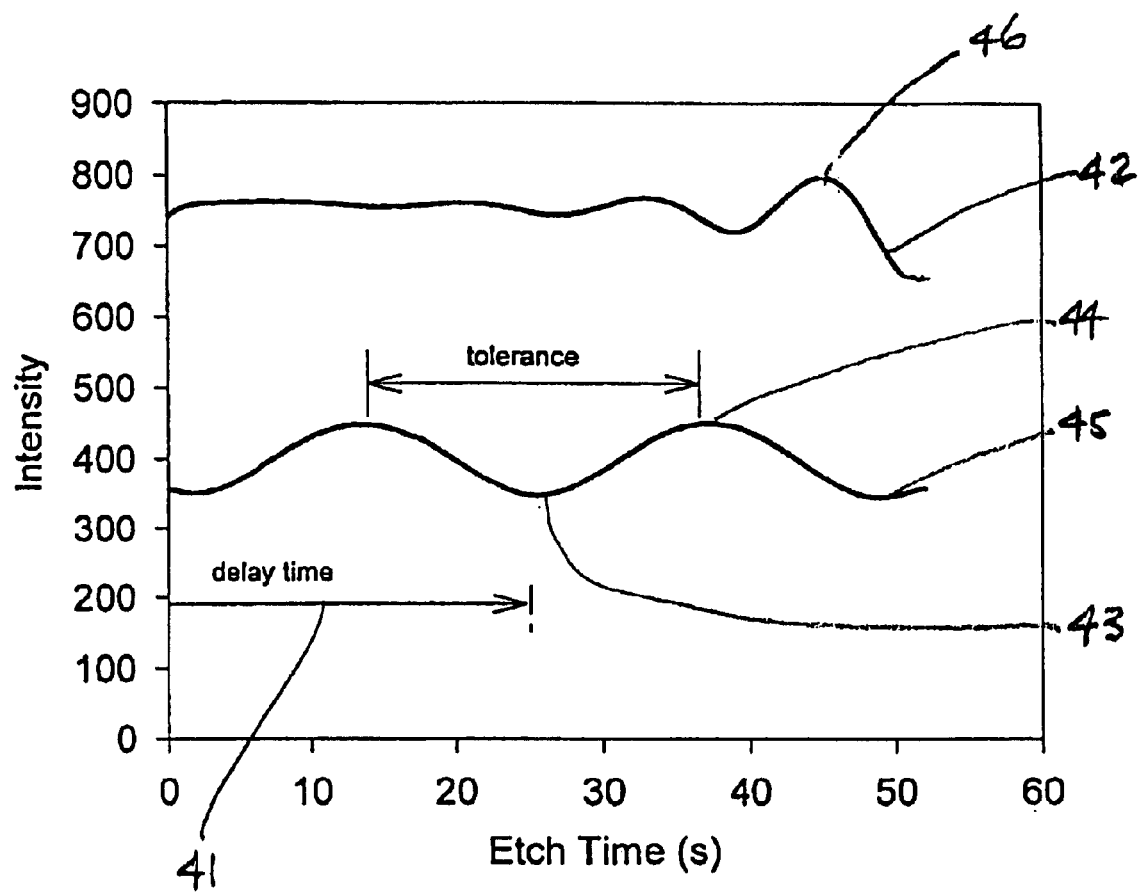
FIG. 4 is a plot showing interferometric traces made during the course of a polysilicon etch, illustrating one embodiment of the method according to the invention.

One embodiment of the method according to the invention is further understood with reference to FIG. 4, showing traces generally as in FIG. 3, for 800 nm (45) and 500 nm (42) only. First, the etch time is estimated. This may be done either by performing a trial etch on a test wafer and inspecting the data as described with reference to FIG. 3, or by derivation or calculation based on known or derived parameters such as approximate layer thickness and approximate etch rate. Then a longer wavelength is selected. A preferred longer wavelength is one to which the material of the layer being etched is relatively highly transparent, and preferably is one that is expected to display at least two distinguishable interference intensity maxima over the estimated etch time. Then a shorter wavelength is selected. A preferred shorter wavelength is one to which the material of the layer is transparent enough to show a distinguishable interference intensity maximum at layer thicknesses that would be encountered following the last maximum at the longer wavelength. For the material treated in this example, a suitable longer wavelength is 800 nm and a suitable shorter wavelength is 500 nm, as discussed above with reference to FIG. 3. The shorter wavelength is chosen according to the process being used as well as according to properties of the layer being etched. Generally, the shorter the second wavelength is, the closer the second wavelength maximum will be to the point where the underlying layer becomes exposed, that is, the later the endpoint will be. Accordingly, where condition of the etch process or of the material being etched are such that an earlier endpoint is favored, then a longer second wavelength is desirable. An earlier etch may be desired, for example, if the etch front is not flat, as where minitrenches form around the edge of the etch; or if composition of the material is not uniform, so that some of the material etches more rapidly; or if the film is not smooth. Then the etch is initiated and the illumination and detection apparatus is turned on. The next step is to detect the last maximum at the longer wavelength. Where, as in this example, there is some certainty that there can be only two maxima prior to endpoint at the longer wavelength, the second maximum is the last maximum prior to endpoint. On the other hand, if for example 600 nm were selected as the longer wavelength, there is some certainty that there can be only three maxima, and the third maximum is the last one prior to endpoint.

Alternatively, to find the last of two or more maxima, a delay time (e.g., 41 in FIG. 4) can be defined as an approximate time period at which a minimum (e.g., 43 in FIG. 4) before the last maximum (e.g., 44 in FIG. 4) is expected to occur, and, accordingly, the last maximum will be the maximum detected following the end of the delay time. The greater the time period between maxima, the greater the tolerance for error around the estimated delay time, and the longer the wavelength, the greater the time period between maxima. In this example, significantly greater margin of error in the delay time is permitted at 800 nm than at 600 nm, for example, and for that reason for this material in a layer of this thickness using the etch technique employed in this example 800 nm may be a preferred longer wavelength. Once the last maximum is detected, the next step is to detect the next maximum (46 in FIG. 4) at the shorter wavelength. The endpoint is at the point where the maximum at the shorter wavelength is detected, or is at a point thereafter. The thickness of the layer remaining to be etched at the point of the maximum at the shorter wavelength depends upon what the shorter wavelength is, as discussed above with reference to FIG. 3. An interval following detection of the shorter wavelength maximum may be programmed or may be selected by the operator.

Figure 5:
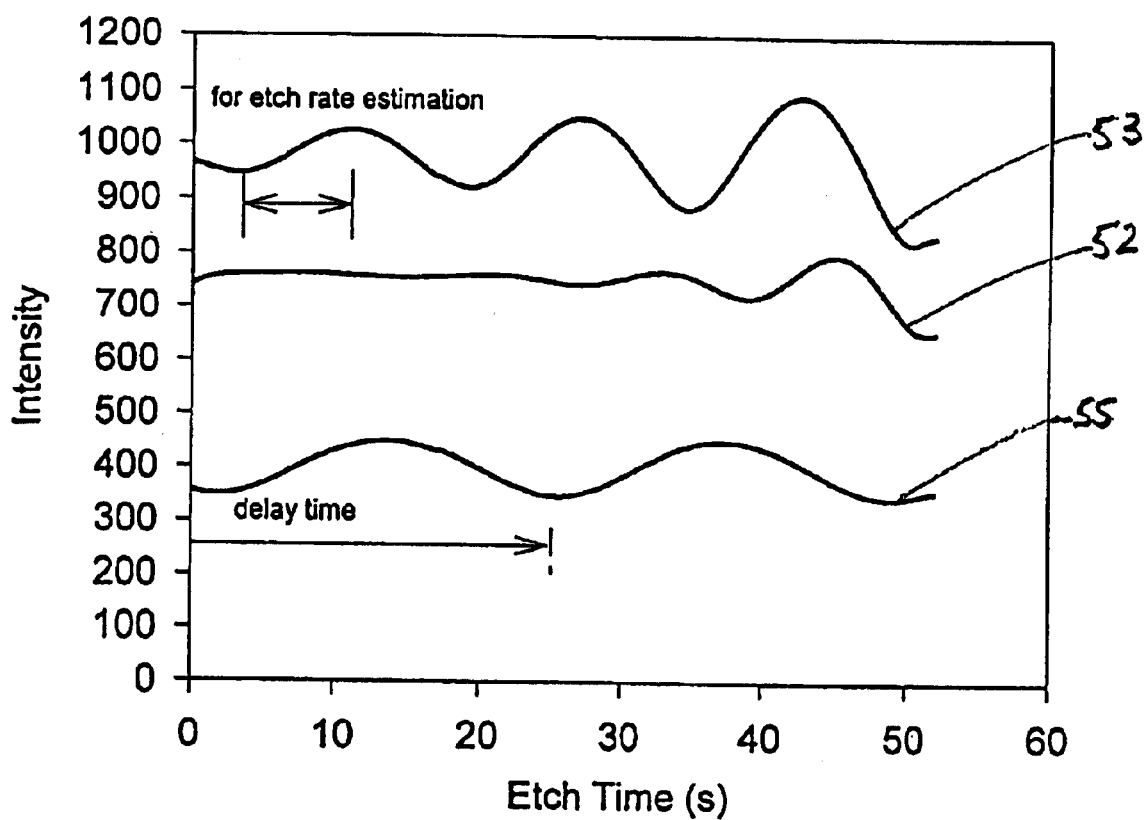
FIG. 5 is a plot showing interferometric traces made during the course of a polysilicon etch, illustrating an alternative embodiment of the method according to the invention.

Another embodiment of the method according to the invention is further understood with reference to FIG. 5. In this embodiment, no operator input of delay time is necessary, as interference intensity at a third wavelength is employed to estimate delay time automatically. Referring to FIG. 5, traces for a longer wavelength 800 nm (55 in FIG. 5) and for a shorter wavelength 500 nm (52 in FIG. 5) are displayed as in FIG. 4. A third wavelength (53 in FIG. 5), here 600 nm for illustration, is employed to calculate an approximate etch rate according to the relation Etch rate=$(1/16)\lambda/\delta t$, where $\delta t$ is the time interval between an intensity minimum and an adjacent intensity maximum at the third wavelength. As shown by way of example in FIG. 5, the first detectable minimum and maximum at the third wavelength can be employed in this calculation. The delay time is calculated from the approximate initial layer thickness and the calculated approximate etch rate. The third wavelength is shorter than the longer wavelength, yet long enough to provide a detectable, minimum and maximum early in the etch cycle, as shown for example in FIG. 5. Referring again to FIG. 3, this material is not sufficiently transparent to wavelengths of 500 nm or 450 nm to provide any detectable minima or maxima early in the etch process at these wavelengths. Although earlier minima and maxima are detectable in the trace at 700 nm, this wavelength may be less preferred than 600 nm for this material at this initial thickness because the first well-discernible maximum is just prior to the desired delay period endpoint.

In still another embodiment, the initial thickness of the layer to be etched may be determined using broad band interferometry by way of the same apparatus as is used during etch. The thickness data may be stored and used without operator input. In this embodiment the operator may input a desired thickness for remaining material at endpoint, and the remainder of the process may by suitable programming be entirely automatic.

As will be appreciated, the traces shown in the examples are intended to illustrate the principle of the method according to the invention, and the data need not be displayed. Moreover, as will be appreciated, only selected portions of the data over the time course of the etch process need be employed. It is to be understood that where the method calls for determination of the point at which a maximum or a minimum occurs, any of a variety of data analysis methods may be employed, which may use any of a variety of mathematical methods, as will be well within the purview of the person of ordinary skill.

Other embodiments are within the following claims.

What is claimed is:

1. A method for determining an endpoint for a main etch of a first layer, comprising:
   estimating a main etch process endpoint;
   applying a main etch process including:
      directing radiant energy at two or more wavelengths onto the first layer;
      detecting a first intensity maximum followed by a next detectable second intensity maximum, the first intensity maximum being;
         reflected from the first layer at a first wavelength; and
         a last detected maximum of intensity of the first wavelength to occur prior to the estimated main etch endpoint; and
      the second intensity maximum being:
         reflected from the first layer at a second wavelength; and
         detected before all of the first layer is removed and without etching into an underlying layer; and
   ending the main etch process.

2. The method of claim 1, wherein the first wavelength is longer than the second wavelength.

3. The method of claim 1, wherein at least two interference maxima occur at the first wavelength during the main etch.

4. The method of claim 1, wherein the first layer includes a material that is at least partially transparent to both the first wavelength and the second wavelength.

5. The method of claim 1, wherein the first layer comprises a polysilicon material.

6. The method of claim 1, wherein the main etch endpoint is when the second intensity maximum is detected.

7. The method of claim 1, wherein the main etch endpoint is taken as being at a point an interval later than the second intensity maximum is detected.

8. A method for determining an endpoint for a main etch of a first layer having an initial thickness, comprising:
   applying the main etch process including:
   directing radiant energy at three or more wavelengths onto the first layer;
   selecting a first wavelength, a second wavelength, and a third wavelengths;
   selecting an etch rate from a time interval between a first detected intensity minimum and an adjacent intensity maximum reflected at the third wavelength, and estimating a main etch endpoint based on the initial thickness of the first layer and the selected etch rate; and
   detecting a first intensity maximum followed by a next detectable second intensity maximum, the first intensity maximum being:
   reflected from the first layer at the first wavelength; and
   a last detected maximum of intensity of the first wavelength to occur prior to the estimated main etch endpoint; and
   the second intensity maximum being:
   reflected from the first layer at the second wavelength; and
   detected before all of the first layer is removed and without etching into an underlying layer.

9. The method of claim 8, wherein the first wavelength is longer than the second wavelength.

10. The method of claim 8, wherein at least two interference maxima occur at the first wavelength during the main etch.

11. The method of claim 8, wherein the first layer includes a material that is at least partially transparent to both the first wavelength and the second wavelength.

12. The method of claim 8, wherein the first layer includes a polysilicon material.

13. The method of claim 8, wherein the main etch endpoint is when the second intensity maximum is detected.

14. The method of claim 8, wherein the main etch endpoint is taken as being at a point an interval later than the second intensity maximum is detected.

15. The method of claim 8, wherein third wavelength is shorter than the first wavelength and longer than the second wavelength.

* * * * *